(12) United States Patent
Takeyama et al.

(10) Patent No.: US 8,778,597 B2
(45) Date of Patent: *Jul. 15, 2014

(54) LONG-CHAIN ALKYLENE-CONTAINING CURABLE EPOXY RESIN COMPOSITION

(75) Inventors: Toshiaki Takeyama, Funabashi (JP); Yuki Endo, Funabashi (JP); Takeo Moro, Tokyo (JP); Kentaro Ohmori, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/521,876

(22) PCT Filed: Jan. 24, 2011

(86) PCT No.: PCT/JP2011/051190
§ 371 (c)(1),
(2), (4) Date: Jul. 12, 2012

(87) PCT Pub. No.: WO2011/093236
PCT Pub. Date: Aug. 4, 2011

(65) Prior Publication Data
US 2012/0295199 A1    Nov. 22, 2012

(30) Foreign Application Priority Data

Jan. 26, 2010  (JP) ................. 2010-014506

(51) Int. Cl.
| | |
|---|---|
| *C08G 59/20* | (2006.01) |
| *C08G 59/32* | (2006.01) |
| *C08G 59/38* | (2006.01) |
| *G03F 7/004* | (2006.01) |
| *C08L 63/00* | (2006.01) |
| *G03F 7/038* | (2006.01) |

(52) U.S. Cl.
CPC ............. *C08G 59/3236* (2013.01); *C08G 59/38* (2013.01); *C08L 63/00* (2013.01); *G03F 7/038* (2013.01)
USPC ......... 430/280.1; 522/170; 528/368; 528/367

(58) Field of Classification Search
CPC .................................................. C08G 59/3236
See application file for complete search history.

(56) References Cited

U.S. PATENT DOCUMENTS

| | | |
|---|---|---|
| 4,376,120 A | 3/1983 | Zeidler et al. |
| 2007/0048531 A1* | 3/2007 | Nagaoka et al. ............ 428/447 |
| 2007/0295956 A1 | 12/2007 | Haitko |
| 2007/0295983 A1 | 12/2007 | Haitko |
| 2007/0299162 A1 | 12/2007 | Haitko |
| 2011/0319589 A1* | 12/2011 | Takeyama et al. ............ 528/363 |
| 2012/0292487 A1* | 11/2012 | Yukawa et al. ............ 250/208.1 |
| 2013/0172522 A1* | 7/2013 | Kasai et al. .................. 528/361 |

FOREIGN PATENT DOCUMENTS

| | | |
|---|---|---|
| EP | 0 602 651 A1 * | 6/1994 |
| JP | A-08-081461 | 3/1996 |
| JP | A-2008-007782 | 1/2008 |
| JP | A-2010-001424 | 1/2010 |
| WO | WO 2006/035641 A1 | 4/2006 |
| WO | WO 2010/092947 A1 | 8/2010 |

OTHER PUBLICATIONS

English-language translation of Feb. 22, 2011 Written Opinion issued in International Patent Application No. PCT/JP2011/051190.
Feb. 22, 2011 Search Report issued in International Patent Application No. PCT/JP2011/051190.

* cited by examiner

*Primary Examiner* — Cynthia Hamilton
(74) *Attorney, Agent, or Firm* — Oliff PLC

(57) ABSTRACT

A curable composition that maintains good handleability in the liquid form and that can be photo- or heat-cured to form a cured product having physical properties including both high transparency and high flexural strength. A curable composition includes, an epoxy compound of (1):

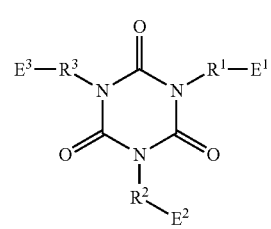

Formula (1)

[where each of $E^1$, $E^2$, and $E^3$ is independently an organic group of Formula (2) or Formula (3); and each of $R^1$, $R^2$, and $R^3$ is independently an optionally branched alkylene group or oxyalkylene group:

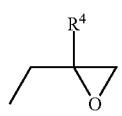

Formula (2)

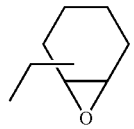

Formula (3)

(where $R^4$ is a hydrogen atom or a methyl group)]; and an acid generator.

9 Claims, No Drawings

LONG-CHAIN ALKYLENE-CONTAINING CURABLE EPOXY RESIN COMPOSITION

TECHNICAL FIELD

The present invention relates to a photo- or heat-curable epoxy resin composition. More specifically, the present invention relates to a photo- or heat-curable resin composition (a resin composition for electronic materials and optical materials) useful for obtaining a cured product having excellent characteristics such as high adhesion to a substrate, high transparency (transparency to visible light), hard coating properties, and high heat resistance and a cured product (composite cured product) from the composition.

BACKGROUND ART

Conventionally, an epoxy resin has been widely used as an epoxy resin composition in combination with a curing agent in the electronic materials field. In such an electronic materials field, in order to be applied to, for example, a high refractive index layer of an anti-reflective coating (for example, an anti-reflective coating for liquid crystal displays), an optical thin film (for example, a reflection plate), a sealing material for electronic parts, a printed circuit board, and an interlayer dielectric material (for example, an interlayer dielectric material for built-up printed boards), forming materials are required to have performances such as high adhesion to a substrate, hard coating properties, high heat resistance, and high transparency to visible light.

In general, a crystalline epoxy resin has a rigid main chain skeleton or is multifunctional and hence has high heat resistance. Therefore, such a resin is used in a field requiring heat-resistant reliability, for example, in an electrical and electronic field.

However, in some fields to which such an epoxy resin is applied, molding cannot be performed except by, for example, casting using a liquid composition. The crystalline epoxy resin is limited to be applied to the molding using a solid material, for example, transfer molding, and the application range is limited.

Conventionally, an epoxy resin used for liquid molding such as casting is a liquid epoxy resin. Hence, such an epoxy resin is difficult to achieve sufficiently satisfactory improvement of physical properties of a cured product, such as heat resistance of which requirement has been increased in fields such as adhesion, casting, sealing, molding, and lamination. To address this, there is an increasing demand for liquefaction of a crystalline multifunctional epoxy resin that can provide a cured product having physical properties such as high heat resistance. In addition, there is a demand for photo- or heat-curing of the liquid epoxy resin.

Meanwhile, there has been disclosed an epoxy resin that is obtained by liquefaction of a highly crystalline epoxy compound such as tris-(2,3-epoxypropyl)-isocyanurate of which some of epoxy groups are esterified to reduce crystalline properties (see Patent Document 1).

There has been also disclosed a compound having a triazinetrione ring to which an epoxy ring is bonded through a long chain alkylene group (see Patent Document 2).

There have been further disclosed an epoxy compound having a triazinetrione ring to which an epoxy ring is bonded through a long chain alkylene group and an epoxy resin composition using the epoxy compound (see Patent Documents 3, 4, and 5).

In addition, there have been disclosed an epoxy compound having a triazinetrione ring to which an epoxycyclohexyl group is bonded through an oxyalkylene group and an epoxy resin composition using the epoxy compound (see Patent Document 6).

RELATED ART DOCUMENTS

Patent Documents

Patent Document 1: International Publication WO 2006/035641 pamphlet
Patent Document 2: U.S. Pat. No. 4,376,120 specification
Patent Document 3: U.S. Patent Application Publication No. 2007/0295956 (A1) specification
Patent Document 4: U.S. Patent Application Publication No. 2007/0295983 (A1) specification
Patent Document 5: U.S. Patent Application Publication No. 2007/0299162 (A1) specification
Patent Document 6: Japanese Patent Application Publication No. JP-A-2010-001424

SUMMARY OF THE INVENTION

Problem to be Solved by the Invention

A liquid epoxy resin is used for potting, coating, casting, and the like because it has characteristics such as good handleability and less trouble during production, for example, increase in viscosity due to crystallization.

In recent years, especially in an electrical and electronic field where, for example, a circuit has been further integrated and a lead-free solder is used, an epoxy resin cured product to be used has been required to have much improved characteristics.

However, a conventional liquid epoxy resin has been difficult to satisfy the characteristics.

To address this, there is an increasing demand for liquefaction of a crystalline multifunctional epoxy resin that can afford a cured product having excellent physical properties such as high heat resistance and for expanding the application range. There is a further demand for photo- or heat-curing of the liquid epoxy resin.

The inventors of the present invention have carried out intensive studies, as a result, have found that photo- or heat-curing of a curable composition including an epoxy resin having a triazine skeleton and an acid generator can form a cured product capable of satisfying both excellent mechanical characteristics and excellent optical characteristics, and the present invention has been accomplished. That is, the present invention intends to provide a curable composition that maintains good handleability in the liquid form and that can be photo- or heat-cured to form a cured product having physical properties including both high transparency and high flexural strength in order to be used as a transparent sealing material for optical semiconductors, for example, as a transparent sealing material for LED (light-emitting diode).

Means for Solving the Problem

The present invention relates to, as a first aspect, a curable composition including an epoxy compound of Formula (1):

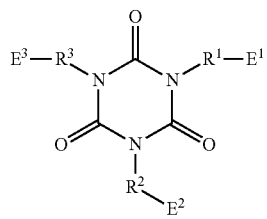

Formula (1)

[where each of $E^1$, $E^2$, and $E^3$ is independently an organic group of Formula (2) or Formula (3); and each of $R^1$, $R^2$, and $R^3$ is independently an optionally branched $C_{2-6}$ alkylene group or oxyalkylene group:

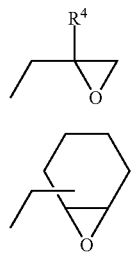

Formula (2)

Formula (3)

(where $R^4$ is a hydrogen atom or a methyl group)] and including an acid generator, as a second aspect, the curable composition according to the first aspect, in which in Formula (1), when each of $E^1$, $E^2$, and $E^3$ is the organic group of Formula (2), each of $R^1$, $R^2$, and $R^3$ is an optionally branched $C_{2-6}$ alkylene group or oxyalkylene group, and when each of $E^1$, $E^2$, and $E^3$ is the organic group of Formula (3), each of $R^1$, $R^2$, and $R^3$ is an optionally branched $C_{2-6}$ alkylene group, as a third aspect, the curable composition according to the second aspect, in which in Formula (1), each of $R^1$, $R^2$, and $R^3$ is a $C_{2-4}$ alkylene group and each of $E^1$, $E^2$, and $E^3$ is the organic group of Formula (2), as a fourth aspect, the curable composition according to the first aspect to the third aspect, in which the acid generator is a photo acid generator or a thermal acid generator, as a fifth aspect, the curable composition according to any one of the first aspect to the fourth aspect, in which the acid generator is an onium salt, as a sixth aspect, the curable composition according to any one of the first aspect to the fourth aspect, in which the acid generator is a sulfonium salt compound or an iodonium salt compound, as a seventh aspect, the curable composition according to any one of the first aspect to the sixth aspect, the curable composition further including, in addition to the epoxy compound (A) of Formula (1), an epoxy compound (B) having at least two epoxy groups and having a structure different from that of the epoxy compound (A), as an eighth aspect, the curable composition according to the seventh aspect, in which the epoxy compound (B) is a compound of Formula (4) or Formula (5):

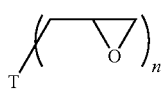

Formula (4)

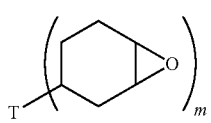

Formula (5)

(where n and m are each an integer of 2 to 5; and T is an optionally substituted divalent to pentavalent organic group of a $C_{1-12}$ alkylene group, a $C_{1-12}$ oxyalkylene group, a $C_{6-20}$ arylene group, a $C_{6-20}$ oxyarylene group, a residue of a triazinetrione ring from which one to three hydrogen atoms are removed, an oxycarbonyl group, or a combination of these), and as a ninth aspect, the curable composition according to any one of the first aspect to the eighth aspect, in which the curable composition includes the acid generator in a ratio of 0.1 to 20% by mass with respect to the epoxy compound.

Effect of the Invention

In the present invention, a liquid epoxy compound having a long chain alkylene group is photo- or heat-cured using a photo acid generator or a thermal acid generator. Accordingly, the use of the photo acid generator or the thermal acid generator eliminates the use of a curing agent (for example, an amine and an acid anhydride) commonly used for an epoxy resin or greatly reduces the content of such a curing agent even when the curing agent is used. Therefore, the curable composition of the present invention has good storage stability.

The epoxy compound included in the curable composition of the present invention has photo-cationic polymerizability and hence has a higher curing speed than that of a conventional liquid epoxy compound (for example, an alicyclic epoxy compound having an epoxycyclohexyl ring). Therefore, the curable composition of the present invention can reduce the amount of an acid generator added or can use a weak acidic acid generator because the curable composition has a high curing speed. The reduction in the amount of an acid generator used is important in order to prevent metal corrosion because the acid generator may leave acid active species even after UV irradiation. The curable composition of the present invention can be cured into a thick film because the curable composition has a high curing speed.

The curable composition of the present invention is suitably used for the manufacture of heat-sensitive materials (equipment) because the curable composition can be cured through photo-curing.

A cured product formed from the curable composition of the present invention has characteristics such as fast curing, transparency, and small curing shrinkage and can be used for coating and adhesion of electronic components, optical components, and precision mechanical components.

MODES FOR CARRYING OUT THE INVENTION

The present invention is a curable composition including the epoxy compound of Formula (1) and an acid generator.

The present invention may further include, in addition to the epoxy compound of Formula (1) and the acid generator, as necessary, a solvent, another epoxy compound, a curing agent, a surfactant, an adhesion accelerator, and the like.

The present invention is a curable composition including the epoxy compound (A) of Formula (1) and an epoxy compound (B) having at least two epoxy groups and having a structure different from that of the epoxy compound (A) in a mass ratio (A)/[(A)+(B)] of 1% by mass, 1.5% by mass or more, or 50 to 100% by mass. The mass ratio (A)/[(A)+(B)] may be 100% by mass, in other words, the epoxy compound used in the present invention can be the epoxy compound (A) alone but may be a mixture of the epoxy compound (A) with the epoxy compound (B) from the viewpoint of production cost.

Conventionally used tris-(2,3-epoxypropyl)-isocyanurate is an epoxy compound excellent in heat resistance, weather resistance, light resistance, transparency to visible light, and the like due to the triazinetrione skeleton. However, it forms a cured product exhibiting a phenomenon in which physical properties are changed depending on a curing temperature. This is supposed to be because tris-(2,3-epoxypropyl)-isocyanurate has a rigid triazinetrione skeleton and is a three-functional epoxy compound having the triazinetrione skeleton to which epichlorohydrins are directly substituted as side chains with three carbon atoms, thermal motion of the end epoxy groups is restricted during curing reaction, and an unreacted epoxy group and an unreacted curing agent are likely to be left. It is also supposed that when two epoxy groups among three epoxy groups are reacted for curing to form cross-linkages, the tris-(2,3-epoxypropyl)-isocyanurate is fixed in a cross-linked structure having a small distance between cross-linked points, this further restricts the thermal motion of the remaining third unreacted epoxy group, and the curing reaction is difficult to occur. It is known that a higher curing temperature accelerates the curing reaction of an unreacted epoxy group to further increase the cross-linking density and this greatly increases a glass transition temperature.

In contrast, in the present invention, the elongation of the side chain between the triazinetrione ring and the epoxy group substituted to the triazinetrione ring reduces intermolecular hydrogen bonds to interfere with triazine stacking and achieves liquefaction as properties. A cured product of such an epoxy compound obtains a stable glass transition temperature by the improved completion of curing reaction of epoxy groups. This leads to a stable cross-linking density even in a heating environment to maintain toughness. In addition, the completion of the curing reaction of epoxy groups in the early stage of curing leads to stable flexural strength and stable elasticity coefficient.

In an epoxy resin obtained by photo- or heat-curing a compound including a triazinetrione ring having nitrogen atoms to which epoxy rings are bonded through a long chain alkylene group, an epoxy resin obtained from a compound having epoxy precursors (for example, allyl groups) in place of the epoxy rings through a long chain alkylene group may have excellent cure strength as compared with an epoxy resin obtained from the compound having three epoxy rings through a long chain alkylene group. This is supposed to be because the epoxy ring through a long chain alkylene group has a large degree of freedom and high reactivity, and thus all the epoxy groups are reacted to be changed into a cured product having high toughness. However, depending on an application, replacement of 2 to 15% by mol (85 to 98% by mol in terms of epoxy purity) of the glycidyl group to an epoxy precursor (for example, an allyl group) suppresses three dimensional cross-linkage to increase the strength, as well as when the allyl groups are polymerized to be cross-linked to each other, the formed bindings are more robust than that from the ring forming cross-linkage of epoxy groups to each other, and a cured product consequently obtains improved strength.

The curable composition of the present invention has a solid content ratio of 1 to 100% by mass, 5 to 100% by mass, 50 to 100% by mass, or 80 to 100% by mass. Here, the solid content is a content of all the components of the curable composition except for a solvent. The present invention uses a liquid epoxy compound and basically does not need to include a solvent in order to mix an acid generator, but can include a solvent as necessary. For example, an acid generator is solid, the acid generator can be dissolved in a solvent such as propylene carbonate, and then the solution can be mixed with a liquid epoxy compound to produce a curable composition. Even when an acid generator is dissolved in a liquid epoxy compound, a common solvent may also be added for viscosity control of a curable composition to be obtained.

The curable composition of the present invention includes the epoxy compound (A) or the epoxy compounds (A) and (B) in an amount of 8 to 99.9% by mass, preferably 40 to 99% by mass, and more preferably 70 to 99% by mass, based on the solid content of the curable composition.

The curable composition of the present invention includes the acid generator in an amount of 0.1 to 20% by mass or 0.1 to 10% by mass based on the solid content of the curable composition. The curable composition of the present invention may include the acid generator in a ratio of 0.1 to 20% by mass or 0.1 to 10% by mass with respect to the epoxy compound.

In Formula (1), each of $R^1$, $R^2$, and $R^3$ is independently an optionally branched $C_{2-6}$ alkylene group or oxyalkylene group.

Examples of the optionally branched $C_{2-6}$ alkylene group include an ethylene group, an n-propylene group, an isopropylene group, a cyclopropylene group, an n-butylene group, an isobutylene group, a sec-butylene group, a tert-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, and a 2-ethyl-3-methyl-cyclopropylene group. In particular, a $C_{2-4}$ alkylene group is preferred.

Examples of the optionally branched $C_{2-6}$ oxyalkylene group include an oxyethylene group, an oxy-n-propylene group, an oxyisopropylene group, an oxycyclopropylene group, an oxy-n-butylene group, an oxyisobutylene group, an oxy-sec-butylene group, an oxy-tert-butylene group, an oxycyclobutylene group, an oxy-1-methyl-cyclopropylene group, an oxy-2-methyl-cyclopropylene group, an oxy-n-pentylene group, an oxy-1-methyl-n-butylene group, an oxy-2-methyl-n-butylene group, an oxy-3-methyl-n-butylene group, an oxy-1,1-dimethyl-n-propylene group, an oxy-1,2-dimethyl-n-propylene group, an oxy-2,2-dimethyl-n-propylene group, an oxy-1-ethyl-n-propylene group, an oxycyclopentylene group, an oxy-1-methyl-cyclobutylene group, an oxy-2-methyl-cyclobutylene group, an oxy-3-methyl-cyclobutylene group, an oxy-1,2-dimethyl-cyclopropylene group, an oxy-2,3-dimethyl-cyclopropylene group, an oxy-1-ethyl-cyclopropylene group, an oxy-2-ethyl-cyclopropylene group, an oxy-n-hexylene group, an oxy-1-methyl-n-pentylene group, an oxy-2-methyl-n-pentylene group, an oxy-3-methyl-n-pentylene group, an oxy-4-methyl-n-pentylene group, an oxy-1,1-dimethyl-n-butylene group, an oxy-1,2-dimethyl-n-butylene group, an oxy-1,3-dimethyl-n-butylene group, an oxy-2,2-dimethyl-n-butylene group, an oxy-2,3-dimethyl-n-butylene group, an oxy-3,3-dimethyl-n-butylene group, an oxy-1-ethyl-n-butylene group, an oxy-2-ethyl-n-butylene group, an oxy-1,1,2-trimethyl-n-propylene group, an oxy-1,2,2-trimethyl-n-propylene group, an oxy-1-ethyl-1-methyl-n-propylene group, an oxy-1-ethyl-2-methyl-n-propylene group, an oxycyclohexylene group, an oxy-1-methyl-cyclopentylene group, an oxy-2-methyl-cyclopentylene group, an oxy-3-methyl-cyclopentylene group, an oxy-1-ethyl-cyclobutylene group, an oxy-2-ethyl-cyclobutylene group, an oxy-3-ethyl-cyclobutylene group, an oxy-1,2-dimethyl-cyclobutylene group, an oxy-1,3-dimethyl-cyclobutylene group, an oxy-2,2-dimethyl-cyclobutylene group, an oxy-2,3-dimethyl-cyclobutylene group, an oxy-2,4-dimethyl-cyclobutylene group, an oxy-3,3-dimethyl-cyclobutylene group, an oxy-1-n-propyl-cyclopropylene group, an oxy-2-n-propyl-cyclopropylene group, an oxy-1-isopropyl-cyclopropylene group, an oxy-2-isopropyl-cyclopropylene group, an oxy-1,2,2-trimethyl-cyclopropylene group, an oxy-1,2,3-trimethyl-cyclopropylene group, an oxy-2,2,3-trimethyl-cyclopropylene group, an oxy-1-ethyl-2-methyl-cyclopropylene group, an oxy-2-ethyl-1-methyl-cyclopropylene group, an oxy-2-ethyl-2-methyl-cyclopropylene group, and an oxy-2-ethyl-3-methyl-cyclopropylene group. In particular, an oxyethylene group and an oxyisopropylene group are preferred.

In Formula (1), each of $E^1$, $E^2$, and $E^3$ is independently the organic group of Formula (2) or the organic group of Formula (3). A usable epoxy compound of Formula (1) may contain the organic group of Formula (2) in a ratio of 67 to 100% by mol and preferably 90 to 100% by mol with respect to the total mole number of $E^1$, $E^2$, and $E^3$ and an organic group of Formula (6):

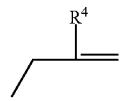

Formula (6)

(where $R^4$ is a hydrogen atom or a methyl group) as the residue.

In Formula (2), $R^4$ is a hydrogen atom or a methyl group.

In Formula (1), when each of $E^1$, $E^2$, and $E^3$ is the organic group of Formula (2), each of $R^1$, $R^2$, and $R^3$ is preferably an optionally branched $C_{2-6}$ alkylene group or oxyalkylene group, and when each of $E^1$, $E^2$, and $E^3$ is the organic group of Formula (3), each of $R^1$, $R^2$, and $R^3$ is preferably an optionally branched $C_{2-6}$ alkylene group.

In Formula (1), $R^1$, $R^2$, and $R^3$ are each a $C_{2-6}$ alkylene group, preferably a $C_{2-4}$ alkylene group, and particularly preferably a $C_{2-3}$ alkylene group (an ethylene group and an n-propylene). $E^1$, $E^2$, and $E^3$ are the organic group of Formula (2) and preferably an organic group in which $R^4$ is a hydrogen atom.

Preferred examples of the epoxy compound of Formula (1) include compounds of Formula (1-1) to Formula (1-12).

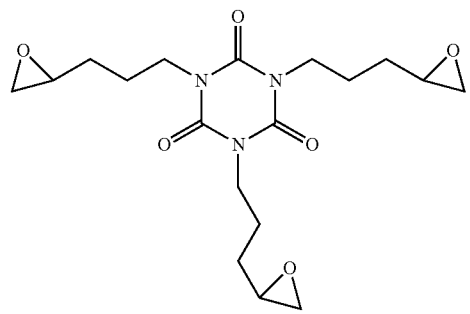

Formula (1-1)

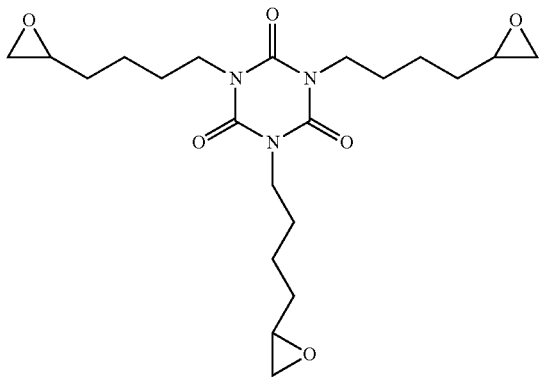

Formula (1-2)

Formula (1-3)
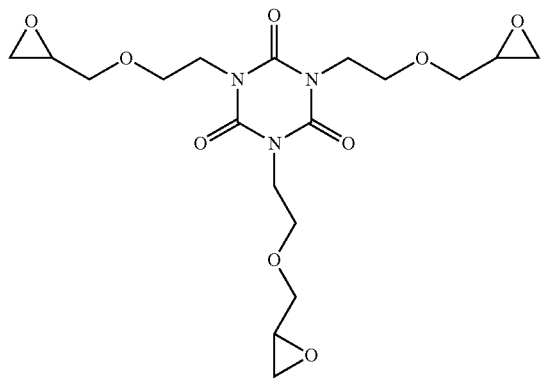
Formula (1-4)
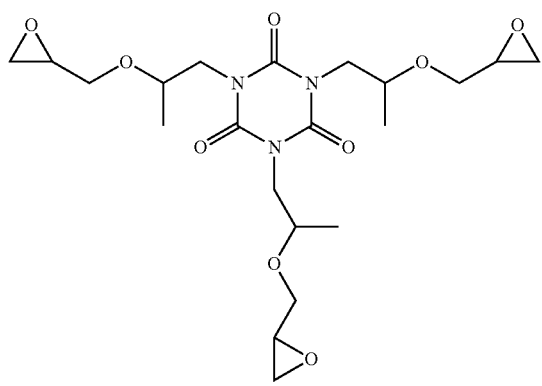
Formula (1-5)
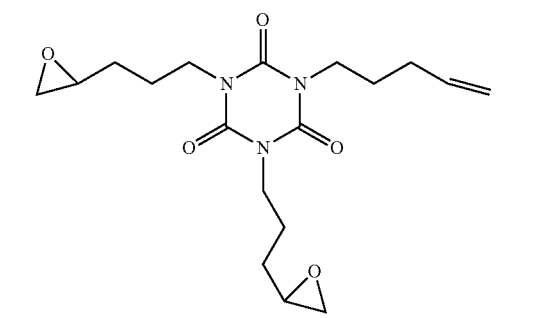
Formula (1-6)
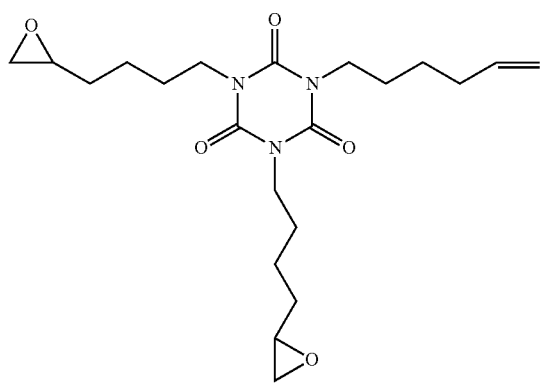
Formula (1-7)
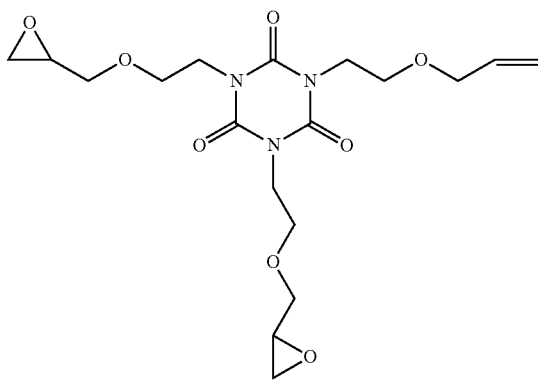
Formula (1-8)
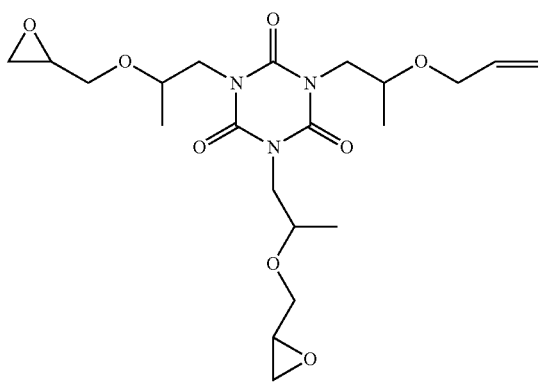
Formula (1-9)
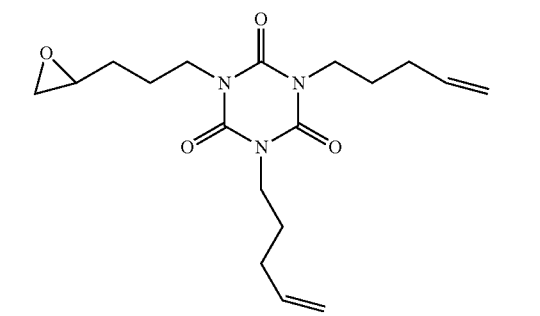
Formula (1-10)
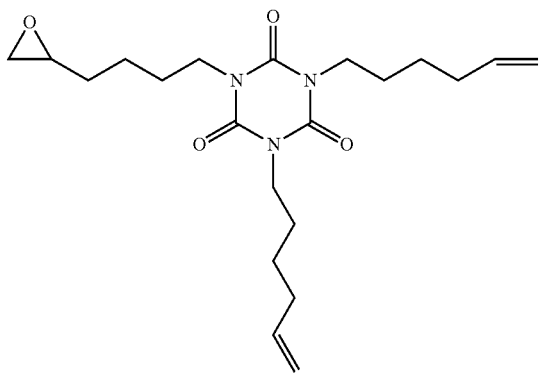

Formula (1-11)

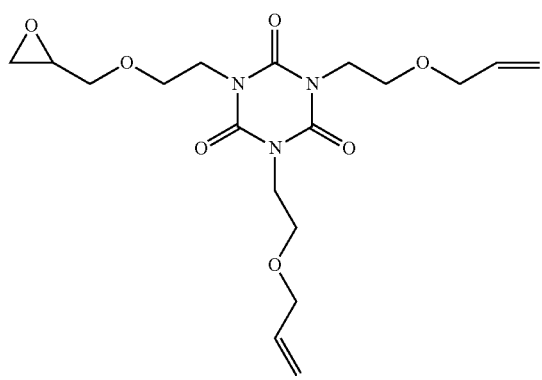

Formula (1-12)

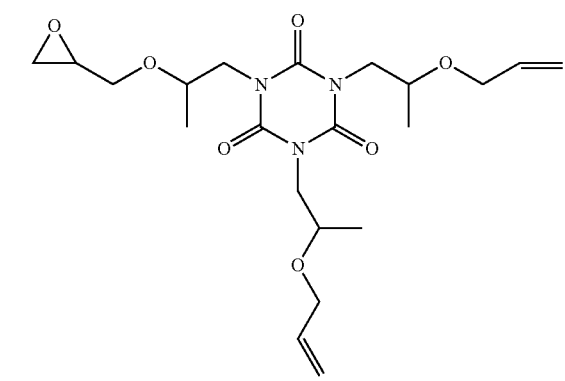

The epoxy compound of Formula (1) used in the present invention can be obtained in accordance with the following manner that is an example for the compound of Formula (1-1).

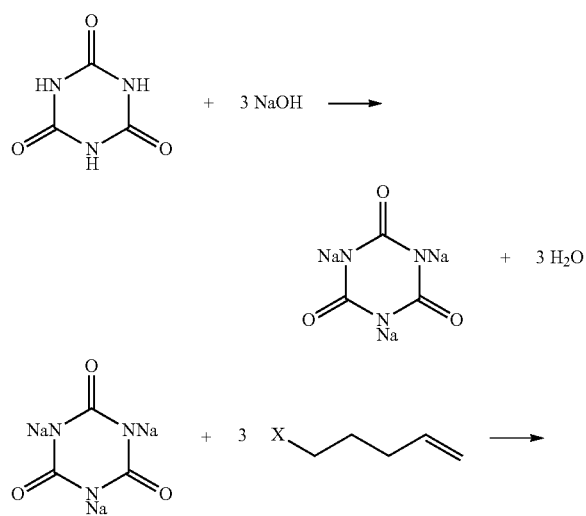

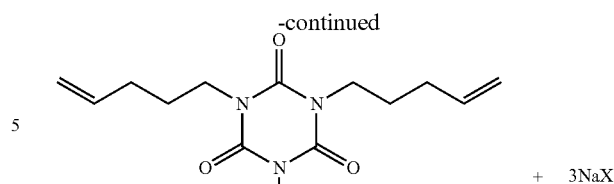

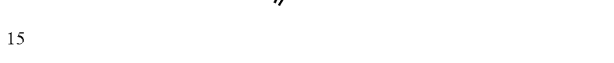

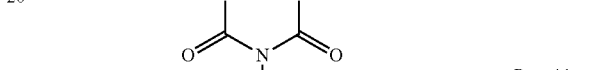

In the reaction, isocyanuric acid is converted into sodium isocyanurate with sodium hydroxide. The reaction can be carried out in a water solvent at 0 to 100° C. for 1 to 10 hours. Then, sodium isocyanurate is reacted with halogenated alkene to afford alkene-substituted isocyanuric acid. The reaction can be carried out, for example, in a DMF (dimethylformamide) solvent at 0 to 150° C. for 1 to 10 hours. In the formulae, X is a halogen atom, and the halogenated alkene to be used may be monobromoalkene or monochloroalkene. Then, the alkene-substituted isocyanuric acid is oxidized with a peracid and the epoxy compound can be obtained. Here, usable examples of the peracid include m-chloroperbenzoic acid, peracetic acid, and hydrogen peroxide-tungstic acid. The reaction can be carried out in a solvent such as methylene chloride and toluene at 0 to 110° C. for 1 to 10 hours. The compounds of Formula (1-2), Formula (1-5), Formula (1-6), Formula (1-9), and Formula (1-10) can also be synthesized in a similar manner.

The epoxy compound of Formula (1) used in the present invention can be obtained in accordance with the following manner that is an example for the compound of Formula (1-3).

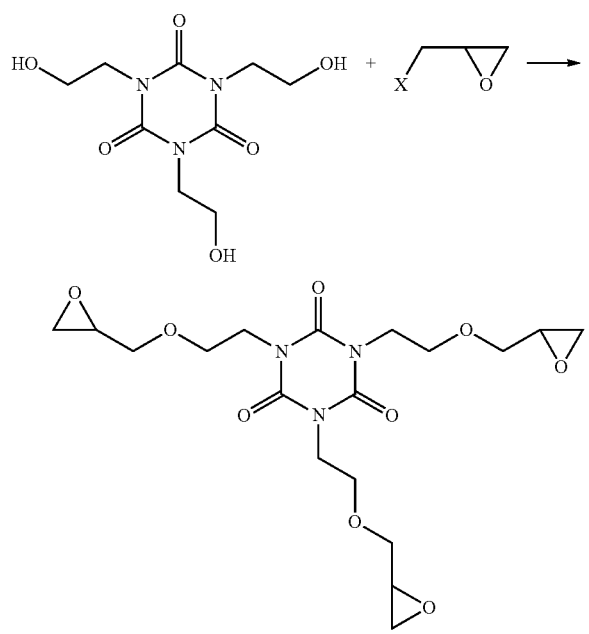

In the reaction, hydroxyalkyl isocyanurate is reacted with an epihalohydrin to afford tris(alkyleneoxyglycidyl) isocyanurate. Usable examples of the hydroxyalkyl isocyanurate include hydroxyethyl isocyanurate. Usable examples of the epihalohydrin include epichlorohydrin and epibromohydrin. The reaction can be carried out in a solvent such as dioxane using $BF_3$ or tin chloride as a catalyst at 0 to 100° C. for 1 to 10 hours. The compounds of Formula (1-4), Formula (1-7), Formula (1-8), Formula (1-11), and Formula (1-12) can also be synthesized in a similar manner.

In Formula (1), when $E^1$, $E^2$, and $E^3$ are the organic group of Formula (3), the epoxy compound of Formula (1) used in the present invention can be synthesized, for example, in accordance with the following manner similar to that in the above.

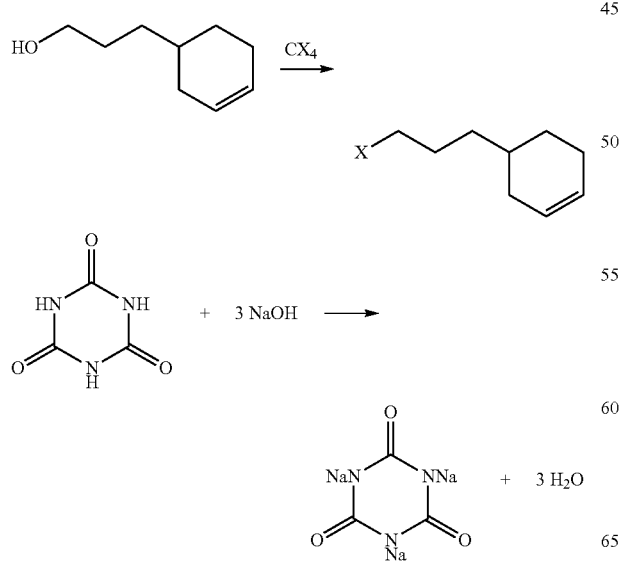

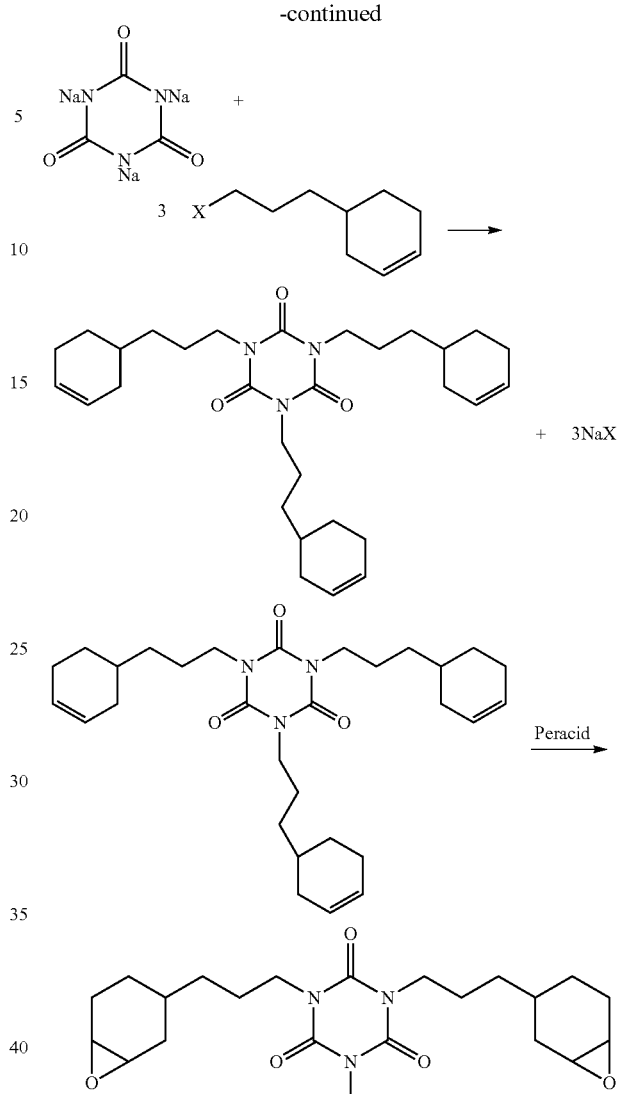

In the reaction, an alcohol is converted into a halogenated alkene with a halogenated carbon. The reaction can be carried out, for example, in a dichloromethane solvent at 0 to 100° C. for 1 to 10 hours. Separately, isocyanuric acid is converted into sodium isocyanurate with sodium hydroxide. The reaction can be carried out in a water solvent at 0 to 100° C. for 1 to 10 hours. Sodium isocyanurate is further reacted with the halogenated alkene to afford alkene-substituted isocyanuric acid. The reaction can be carried out, for example, in a DMF (dimethylformamide) solvent at 0 to 150° C. for 1 to 10 hours. In the formulae, X is a halogen atom, and usable examples of the halogenated alkene include monobromoalkene and monochloroalkene. Then, the alkene-substituted isocyanuric acid is oxidized with a peracid and the epoxy compound can be obtained. Here, usable examples of the peracid include m-chloroperbenzoic acid, peracetic acid, and hydrogen peroxide-tungstic acid. The reaction can be carried out in a solvent such as methylene chloride and toluene at 0 to 110° C. for 1 to 10 hours.

The epoxy compound (B) is the epoxy compound of Formula (4) or Formula (5) and is a compound having two to five epoxy groups in the molecule. In Formula (4) or Formula (5), n and m are each an integer of 2 to 5, and T is an optionally substituted divalent to pentavalent organic group of a $C_{1-12}$ alkylene group, a $C_{1-12}$ oxyalkylene group, a $C_{6-20}$ arylene group, a $C_{6-20}$ oxyarylene group, a residue of a triazinetrione ring from which one to three hydrogen atoms are removed, an oxycarbonyl group, or a combination of these.

The epoxy compounds of Formula (4) and Formula (5) are exemplified below.

A liquid epoxy compound (Formula (4-1), manufactured by Nissan Chemical Industries, Ltd., trade name: TEPIC-PAS B22) that is obtained by modification of 1 mol of tris-(2,3-epoxypropyl)-isocyanurate with 0.8 mol of propionic anhydride.

Formula (4-1)

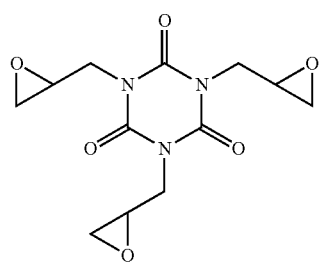
(4-1-1)

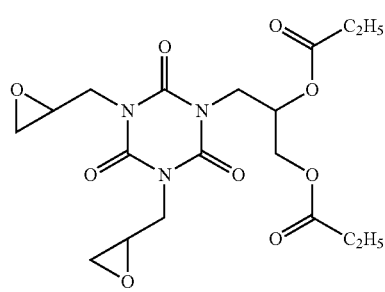
(4-1-2)

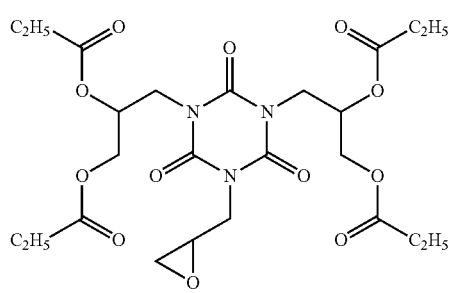
(4-1-3)

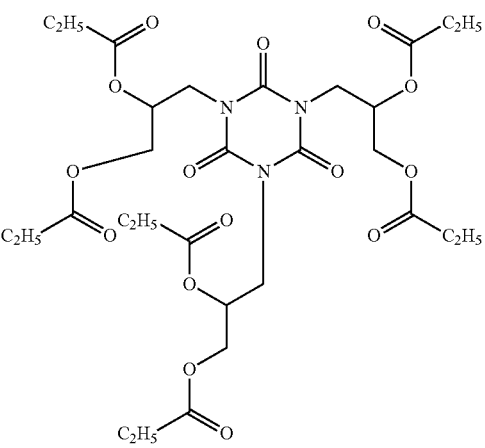
(4-1-4)

The compound of Formula (4-1) includes compounds of (4-1-1), (4-1-2), (4-1-3), and (4-1-4) in a molar ratio of about 35%:45%:17%:3%. At the time of production, the compound has a viscosity of 1,800 mPas at 60° C., and even after 90 days, it has a viscosity of 1,900 mPas at 60° C. This reveals that the compound is stable. The viscosity was determined with an E-type viscometer (VISCONIC type ED) manufactured by Tokimec, Inc.

A liquid epoxy compound (Formula (4-2), manufactured by Nissan Chemical Industries, Ltd., trade name: TEPIC-PAS B26) that is obtained by modification of 1 mol of tris-(2,3-epoxypropyl)-isocyanurate with 0.4 mol of propionic anhydride.

Formula (4-2)

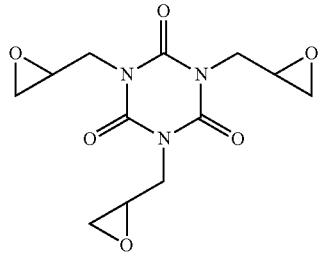
(4-2-1)

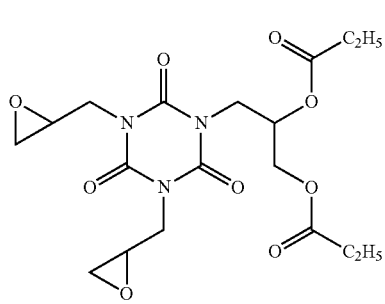
(4-2-2)

Formula (4-2-3)

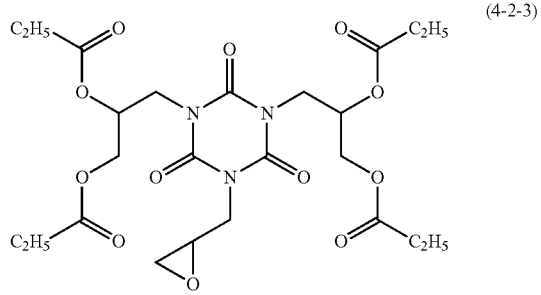

The compound of Formula (4-2) includes compounds of (4-2-1), (4-2-2), and (4-2-3) in a molar ratio of about 60%:32%:8%. At the time of production, the compound has a viscosity of 2,800 mPas at 60° C., and even after 90 days, it has a viscosity of 3,000 mPas at 60° C. This reveals that the compound is stable. The viscosity was determined with an E-type viscometer (VISCONIC type ED) manufactured by Tokimec, Inc.

A solid epoxy compound, tris-(2,3-epoxypropyl)-isocyanurate (Formula (4-3), manufactured by Nissan Chemical Industries, Ltd., trade name: TEPIC).

Formula (4-3)

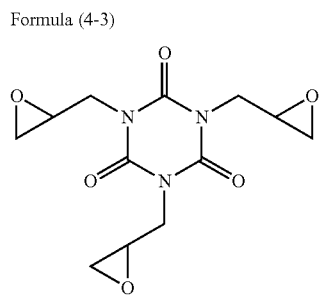

A liquid epoxy compound (Formula (4-4), manufactured by Japan Epoxy Resin Co., Ltd., trade name: EPICOAT 828).

Formula (4-4)

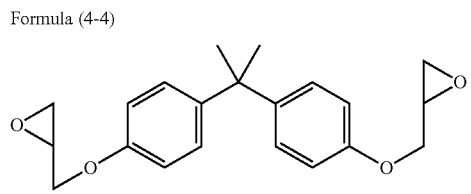

A liquid epoxy compound (Formula (4-5), manufactured by Japan Epoxy Resin Co., Ltd., trade name: YX8000).

Formula (4-5)

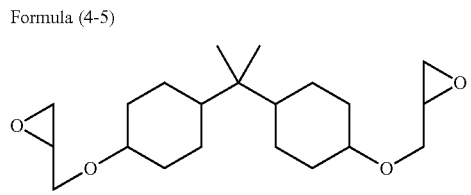

A liquid epoxy compound (Formula (4-6), manufactured by New Japan Chemical Co., Ltd., trade name: DME100).

Formula (4-6)

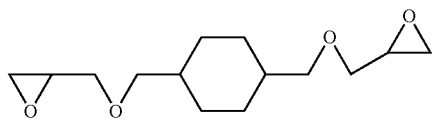

A liquid epoxy compound (Formula (5-1), manufactured by Daicel Corporation, trade name: CE-2021P).

Formula (5-1)

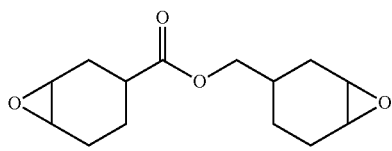

In the present invention, the following compounds can also be used as a liquid epoxy compound.

Formula (6-1)

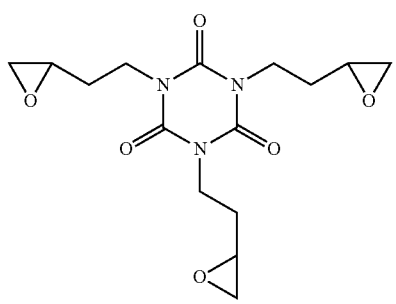

Formula (6-2)

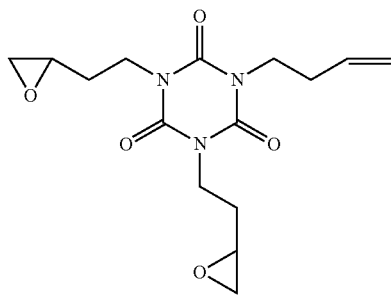

Formula (6-3)

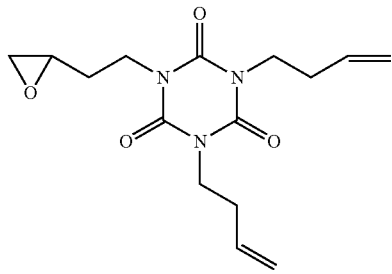

In the present invention, a vinyl ether compound, an oxetane compound, a carbonate compound, a dithiocarbonate compound, and the like can be used as a cationic curable monomer in addition to the epoxy compound.

The vinyl group-containing compound (such as a vinyl ether compound) is not particularly limited as long as a compound has a vinyl group, and examples of the vinyl group-containing compound include 2-hydroxyethyl vinyl ether (HEVE), diethylene glycol monovinyl ether (DEGV), 2-hydroxybutyl vinyl ether (HBVE), and triethylene glycol divinyl ether. A vinyl compound having a substituent such as an alkyl group and an allyl group at the α position and/or β position may also be used. A vinyl ether compound having a cyclic ether group such as an epoxy group and/or an oxetane group may also be used, and examples of such a vinyl ether compound include oxynorbornene divinyl ether and oxetane-3,3-dimethanol divinyl ether. Furthermore, a hybrid compound having a vinyl group and a (meth)acrylic group may be used, and examples of such a hybrid compound include 2-(2-vinyloxyethoxy)ethyl(meth)acrylate (VEEA and VEEM). These compounds may be used singly or in combination of two or more of them.

The oxetanyl group-containing compound (oxetane compound) is not particularly limited as long as a compound has an oxetanyl group, and examples of the oxetanyl group-containing compound include 3-ethyl-3-(phenoxymethyl)oxetane (PDX), di[1-ethyl-(3-oxetanyl)]methyl ether (DOX), 3-ethyl-3-(2-ethylhexyloxymethyl)oxetane (EHOX), 3-ethyl-3-{[3-(triethoxysilyl)propoxy]methyl}oxetane (TESOX), oxetanyl silsesquioxane (OX-SQ), and phenol novolac oxetane (PNOX-1009). 1-Ethyl-3-oxetanylmethyl (meth)acrylate that is a hybrid compound having an oxetanyl group and a (meth)acrylic group may also be used. These compounds may be used singly or in combination of two or more of them.

The carbonate compound and the dithiocarbonate compound are not particularly limited as long as a compound has a carbonate group or a dithiocarbonate group in the molecule.

As the acid generator used in the present invention, a photo acid generator or a thermal acid generator can be used.

The photo acid generator or the thermal acid generator is not particularly limited as long as an acid generator directly or indirectly generates an acid by photoirradiation or heat.

Specific examples of the photo acid generator include a triazine compound, an acetophenone derivative compound, a disulfone compound, a diazomethane compound, a sulfonic acid derivative compound, an onium salt such as an iodonium salt, a sulfonium salt, a phosphonium salt, and a selenium salt, a metallocene complex, and an iron-arene complex.

Examples of the iodonium salt include diphenyliodonium chloride, diphenyliodonium trifluoromethanesulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoroarsenate, bis(p-tert-butylphenyl)iodonium hexafluorophosphate, bis(p-tert-butylphenyl) iodonium mesylate, bis(p-tert-butylphenyl)iodonium tosylate, bis(p-tert-butylphenyl)iodonium trifluoromethanesulfonate, bis(p-tert-butylphenyl)iodonium tetrafluoroborate, bis(p-tert-butylphenyl)iodonium chloride, bis(p-chlorophenyl)iodonium chloride, and bis(p-chlorophenyl) iodonium tetrafluoroborate. Additional examples include a bis(alkylphenyl)iodonium salt such as bis(4-tert-butylphenyl)iodonium hexafluorophosphate; and a bis(alkoxyphenyl) iodonium salt such as an alkoxycarbonylalkoxy-trialkylaryliodonium salt (for example, 4-[(1-ethoxycarbonyl-ethoxy)phenyl]-(2,4,6-trimethylphenyl)-iodonium hexafluorophosphate) and a bis(alkoxyaryl)iodonium salt (for example, (4-methoxyphenyl)phenyliodonium hexafluoroantimonate).

Examples of the sulfonium salt include a triphenylsulfonium salt such as triphenylsulfonium chloride, triphenylsulfonium bromide, tri(p-methoxyphenyl)sulfonium tetrafluoroborate, tri(p-methoxyphenyl)sulfonium hexafluorophosphonate, tri(p-ethoxyphenyl)sulfonium tetrafluoroborate, triphenylsulfonium triflate, triphenylsulfonium hexafluoroantimonate, and triphenylsulfonium hexafluorophosphate; and a sulfonium salt such as (4-phenylthiophenyl)diphenylsulfonium hexafluoroantimonate, (4-phenylthiophenyl)diphenylsulfonium hexafluorophosphate, bis[4-(diphenylsulfonio)phenyl]sulfide bis-hexafluoroantimonate, bis[4-(diphenylsulfonio)phenyl]sulfide bis-hexafluorophosphate, and (4-methoxyphenyl) diphenylsulfonium hexafluoroantimonate.

Examples of the phosphonium salt include triphenylphosphonium chloride, triphenylphosphonium bromide, tri(p-methoxyphenyl)phosphonium tetrafluoroborate, tri(p-methoxyphenyl)phosphonium hexafluorophosphonate, tri(p-ethoxyphenyl)phosphonium tetrafluoroborate, 4-chlorobenzenediazonium hexafluorophosphate, and benzyltriphenylphosphonium hexafluoroantimonate.

Examples of the metallocene complex include a selenium salt such as triphenylselenium hexafluorophosphate and (η5- or η6-isopropylbenzene)(η5-cyclopentadienyl)iron (II) hexafluorophosphate.

As the photo acid generator, the following compounds may also be used.

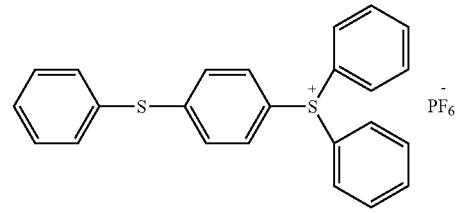

Formula (A-1)

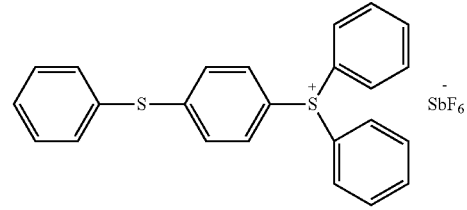

Formula (A-2)

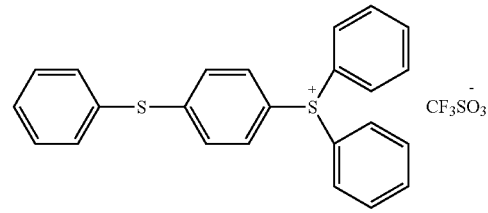

Formula (A-3)

-continued

Formula (A-4)

Formula (A-5)

Formula (A-6)

(Formula (A-7))

Formula (A-8)

Formula (A-9)

Formula (A-10)

-continued

Formula (B-1)

Formula (B-2)

Formula (B-3)

Formula (B-4)

Formula (B-5)

Formula (B-6)

Formula (B-7)

Formula (B-8)

Formula (B-9)

Formula (B-10)

Formula (B-11)

Formula (B-12)
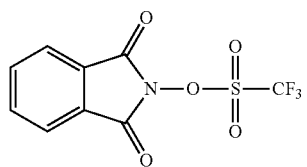
Formula (B-13)
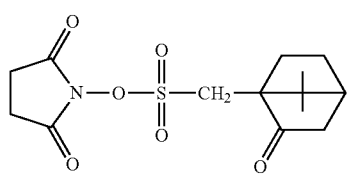
Formula (B-14)
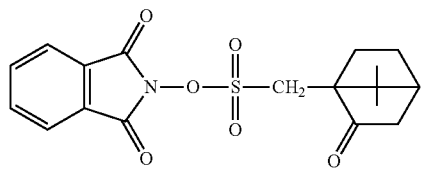
Formula (B-15)
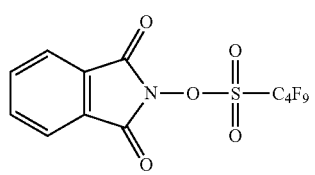
Formula (B-16)
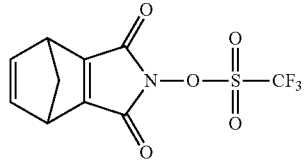
Formula (B-17)
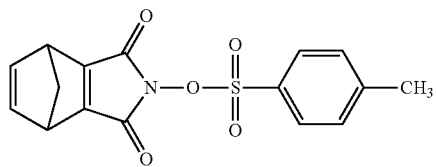
Formula (B-18)
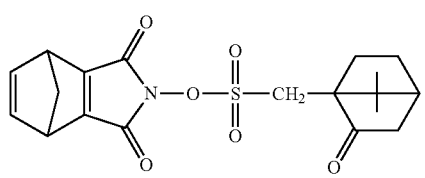
Formula (B-19)
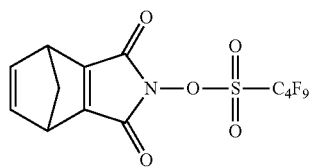
Formula (B-20)
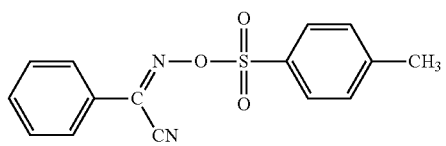
Formula (B-21)
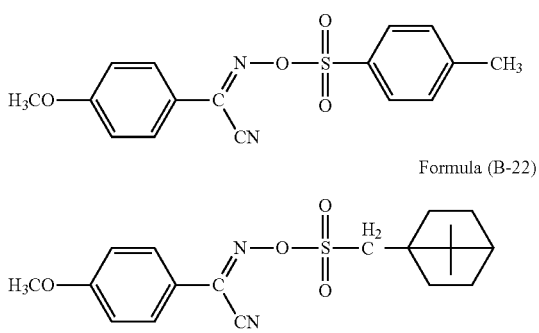
Formula (B-22)
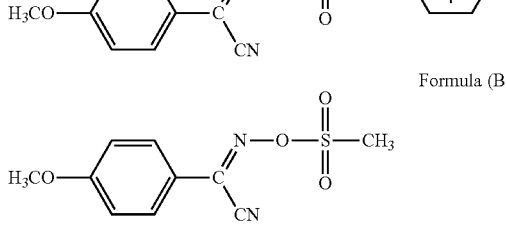
Formula (B-23)
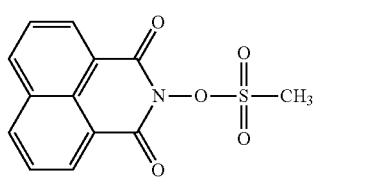
Formula (B-24)
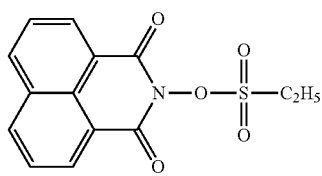
Formula (B-25)
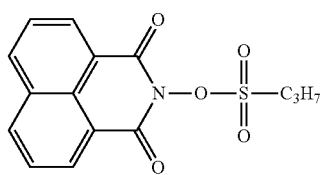
Formula (B-26)
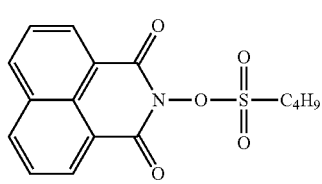
Formula (B-27)
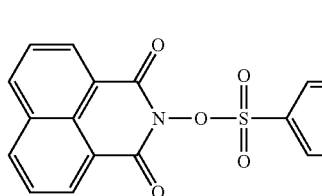
Formula (B-28)
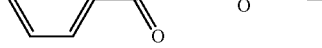

Formula (B-29)
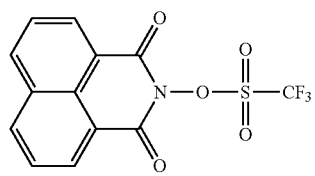
Formula (B-30)
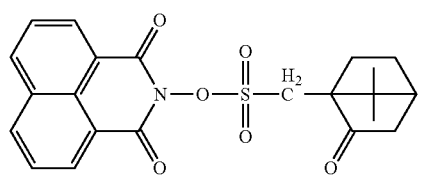
Formula (B-31)
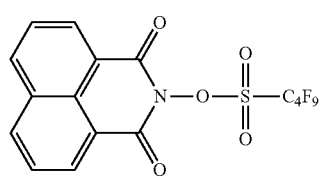
Formula (B-32)
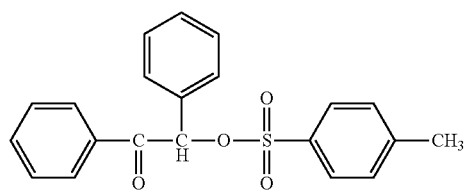
Formula (B-33)
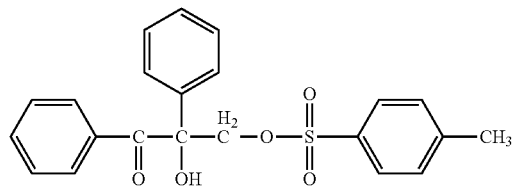
Formula (B-34)
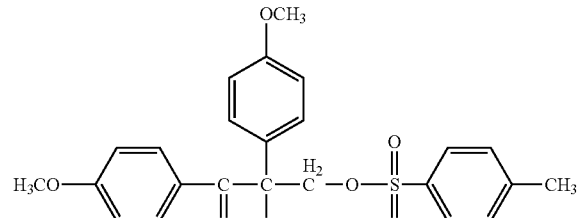
Formula (B-35)
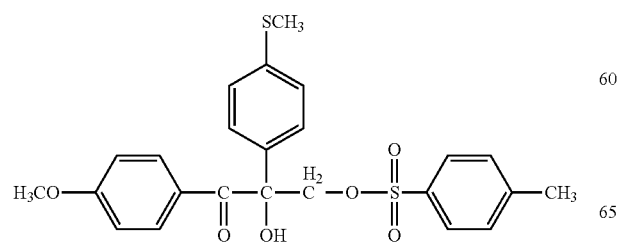
Formula (B-36)
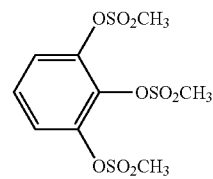
Formula (B-37)
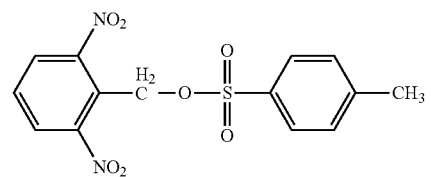
Formula (B-38)
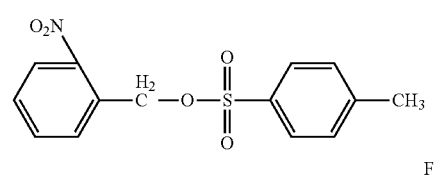
Formula (B-39)
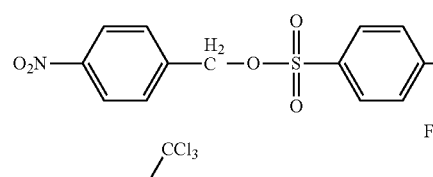
Formula (B-40)
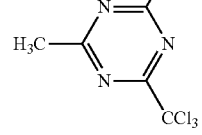
Formula (B-41)
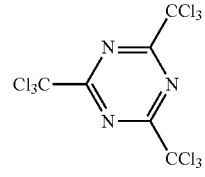
Formula (B-42)
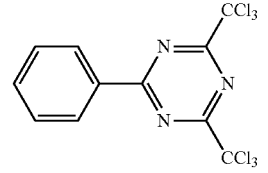
Formula (B-43)
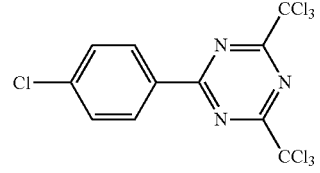
Formula (B-44)
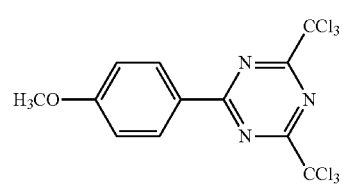

Formula (B-45)
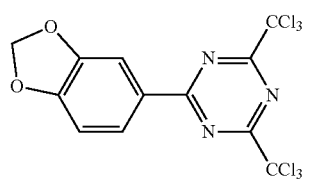

Formula (B-46)
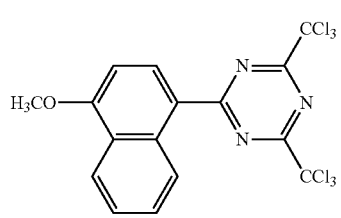

Formula (B-47)
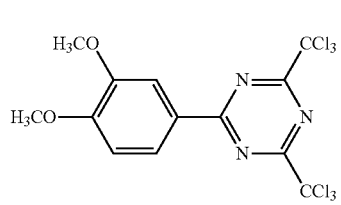

Formula (B-48)
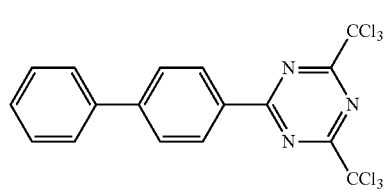

Formula (B-49)
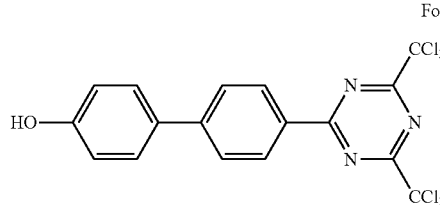

Formula (B-50)
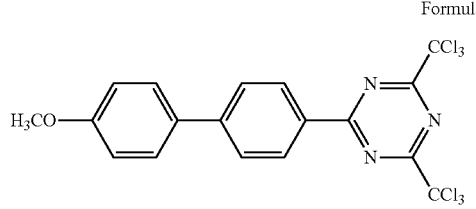

Formula (B-51)
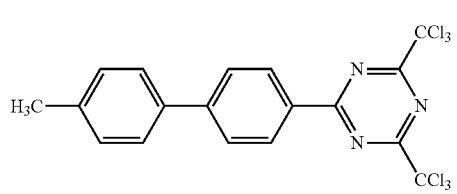

Formula (B-52)
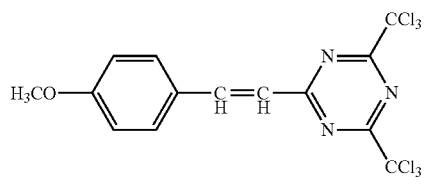

Formula (B-53)
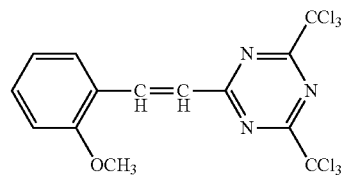

Formula (B-54)
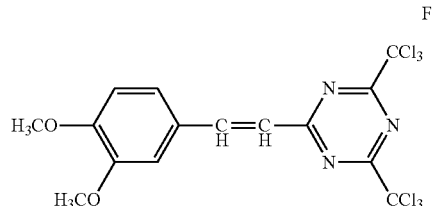

Formula (B-55)
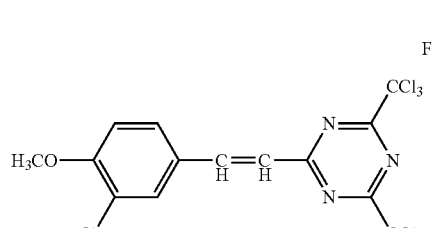

Formula (B-56)
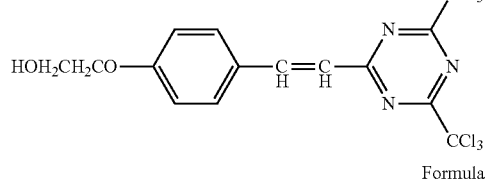

Formula (B-57)
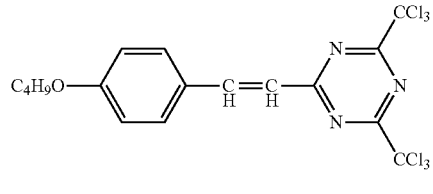

As the photo acid generator, a sulfonium salt compound or an iodonium salt compound are preferred. Examples of anionic species for such a photo acid generator include $CF_3SO_3^-$, $C_4F_9SO_3^-$, $C_8F_{17}SO_3^-$, camphorsulfonate anion, tosylate anion, $BF_4^-$, $PF_6^-$, $AsF_6^-$, and $SbF_6^-$. In particular, anionic species exhibiting strong acidity, such as hexafluorophosphate and hexafluoroantimonate are preferred.

Preferred photo acid generators are, for example, the compounds of Formula (A-1), Formula (A-2), Formula (A-3), Formula (A-8), Formula (A-9), and Formula (A-10) and the compounds of Formula (A-1) and Formula (A-2) are particularly preferred. These photo acid generators may be used singly or in combination of two or more of them.

Examples of the thermal acid generator include a sulfonium salt and a phosphonium salt, and the sulfonium salt is preferably used.

As the thermal acid generator, the following compounds can be exemplified.

Formula (C-1)

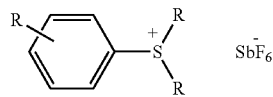

Formula (C-2)

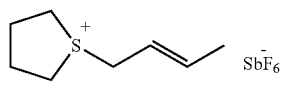

In Formula (C-1), each of Rs is independently a $C_{1-12}$ alkyl group or a $C_{6-20}$ aryl group, and a $C_{1-12}$ alkyl group is particularly preferred.

These thermal acid generators may be used singly or in combination of two or more of them.

The curable composition of the present invention may include a solvent.

Examples of the solvent include alcohols such as methanol and ethanol; ethers such as tetrahydrofuran; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether, diethylene glycol dimethyl ether, diethylene glycol diethyl ether, and diethylene glycol ethyl methyl ether; propylene glycol monoalkyl ethers such as propylene glycol methyl ether, propylene glycol ethyl ether, propylene glycol propyl ether, and propylene glycol butyl ether; propylene glycol alkyl ether acetates such as propylene glycol methyl ether acetate, propylene glycol ethyl ether acetate, propylene glycol propyl ether acetate, and propylene glycol butyl ether acetate; propylene glycol alkyl ether acetates such as propylene glycol methyl ether propionate, propylene glycol ethyl ether propionate, propylene glycol propyl ether propionate, and propylene glycol butyl ether propionate; aromatic hydrocarbons such as toluene and xylene; ketones such as methyl ethyl ketone, cyclohexanone, and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate.

The curable composition of the present invention may include a commonly used additive as necessary. Examples of such an additive include a pigment, a coloring agent, a thickener, a sensitizer, a antifoaming agent, a leveling agent, a coating property modifier, a lubricant, a stabilizer (for example, an antioxidant, a heat stabilizer, and a light resistant stabilizer), a plasticizer, a surfactant, a dissolution accelerator, a filler, an antistatic agent, and a curing agent. These additives may be used singly or in combination of two or more of them.

The curable composition of the present invention may include a surfactant in order to improve coating properties. Examples of the surfactant include, but are not necessarily limited to, a fluorochemical surfactant, a silicone surfactant, and a nonionic surfactant. These surfactants may be used singly or in combination of two or more of them.

Among the surfactants, the fluorochemical surfactant is preferred because it has high coating property improving effect.

Specific examples of the fluorochemical surfactant include, but are not necessarily limited to, EFTOP [registered trademark] EF301, EFTOP EF303, and EFTOP EF352 (manufactured by Mitsubishi Materials Electronic Chemicals Co., Ltd. (formerly Tochem Products)), MEGAFAC [registered trademark] F171, MEGAFAC F173, MEGAFAC R-30, MEGAFAC R-08, MEGAFAC R-90, MEGAFAC BL-20, and MEGAFAC F-482 (manufactured by DIC Corporation (formerly Dainippon Ink and Chemicals, Inc.)), Fluorad FC 430 and Fluorad FC431 (manufactured by Sumitomo 3M), and Asahiguard [registered trademark] AG710, Surflon [registered trademark] S-382, SC101, SC102, SC103, SC104, SC105, and SC106 (manufactured by Asahi Glass Co., Ltd.).

The curable composition of the present invention includes a surfactant in an amount of 0.0008 to 4.5% by mass, preferably 0.0008 to 2.7% by mass, and more preferably 0.0008 to 1.8% by mass, based on the solid content of the curable composition.

The curable composition of the present invention may include an adhesion accelerator in order to improve the adhesion to a substrate after development. Examples of the adhesion accelerator include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, γ-methacryloxypropyltrimethoxysilane, γ-glycidoxypropyltrimethoxysilane, and γ-(N-piperidinyl)propyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; ureas such as 1,1-dimethylurea and 1,3-dimethylurea; and thiourea compounds. These adhesion accelerators may be used singly or in combination of two or more of them. The curable composition of the present invention commonly includes an adhesion accelerator in an amount of 18% by mass or less, preferably 0.0008 to 9% by mass, and more preferably 0.04 to 9% by mass, based on the solid content of the curable composition.

The curable composition of the present invention may include a sensitizer. Examples of the sensitizer include anthracene, phenothiazine, perylene, thioxanthone, benzophenone, and thioxanthone. Examples of a sensitizing dye include a thiopyrylium salt dye, a merocyanine dye, a quinoline dye, a styrylquinoline dye, a ketocoumarin dye, a thioxanthene dye, a xanthene dye, an oxonol dye, a cyanine dye, a rhodamine dye, and a pyrylium salt dye. The anthracene sensitizer is particularly preferred and the combination use of the anthracene sensitizer with a cationic curing catalyst (radiosensitive cationic polymerization initiator) significantly improves sensitivity as well as exhibits a radical polymerization initiation function. Accordingly, in a hybrid type employing both a cation curing system and a radical curing system as in the present invention, simple catalyst species can be used. Specific effective examples of the anthracene compound include dibutoxyanthracene and dipropoxyanthraquinone. The curable composition of the present invention includes a sensitizer in an amount of 0.01 to 20% by mass and preferably 0.01 to 10% by mass based on the solid content of the curable composition.

In the present invention, a curable composition including the epoxy compound of Formula (1) and a photo acid generator can be cured by applying the composition onto a substrate followed by photoirradiation. The composition may be heated before and after the photoirradiation. At this time, the composition may further include, in addition to the epoxy compound (A) of Formula (1), an epoxy compound (B) having at least two epoxy groups and having a structure different from that of the epoxy compound (A).

In the present invention, a curable composition including the epoxy compound of Formula (1) and a thermal acid generator can be cured by applying the composition onto a substrate followed by heating. At this time, the composition may further include, in addition to the epoxy compound (A) of Formula (1), an epoxy compound (B) having at least two epoxy groups and having a structure different from that of the epoxy compound (A).

In the present invention, a curable composition including the epoxy compound of Formula (1), a thermal acid generator, and a photo acid generator can be cured by applying the composition onto a substrate followed by heating, and then photoirradiation. At this time, the composition may further include, in addition to the epoxy compound (A) of Formula (1), an epoxy compound (B) having at least two epoxy groups and having a structure different from that of the epoxy compound (A).

Examples of the method of applying the curable composition of the present invention onto a substrate include flow coating, spin coating, spray coating, screen printing, casting, bar coating, curtain coating, roll coating, gravure coating, dipping, and slitting.

The film thickness of a coating formed from the curable composition of the present invention can be selected from a range of about 0.01 μm to 10 mm depending on an application of the cured product. For example, the film thickness may be about 0.05 to 10 μm (especially 0.1 to 5 μm) when the curable composition is used for a photoresist; the film thickness may be about 10 μm to 5 mm (especially 100 μm to 1 mm) when the curable composition is used for a printed circuit board; and the film thickness may be about 0.1 to 100 μM (especially 0.3 to 50 μm) when the curable composition is used for an optical thin film.

Examples of irradiation or exposure light when a photo acid generator is used include gamma rays, X rays, ultraviolet light, and visible light. Typically, visible light or ultraviolet light is used and in particular, ultraviolet light is used in many cases.

The light has a wavelength of, for example, about 150 to 800 nm, preferably about 150 to 600 nm, more preferably about 200 to 400 nm, and particularly about 300 to 400 nm.

The intensity of irradiation light varies depending on the film thickness of a coating but may be, for example, about 2 to 20,000 mJ/cm$^2$ and preferably about 5 to 5,000 mJ/cm$^2$.

A light source can be selected in accordance with the type of exposing light, and usable examples of the light source for ultraviolet light include a low pressure mercury lamp, a high pressure mercury lamp, an ultrahigh pressure mercury lamp, a deuterium lamp, a halogen lamp, and a laser beam (for example, helium-cadmium laser and excimer laser). Such photoirradiation promotes curing reaction of the curable composition including the epoxy compound of Formula (1) and the photo acid generator of the present invention.

Heating when a thermal acid generator is used and heating of a coating performed as necessary after photoirradiation when a photo acid generator is used are performed, for example, at about 60 to 250° C. and preferably at about 100 to 200° C.

Heating time can be selected in a range of 3 seconds or more (for example, about 3 seconds to 5 hours) and is, for example, about 5 seconds to 2 hours, preferably about 20 seconds to 30 minutes, and typically about 1 minute to 3 hours (for example, about 5 minutes to 2.5 hours).

When a pattern or an image is formed (for example, when a printed circuit board is produced), the coating formed on a substrate may be subjected to pattern exposure. The pattern exposure may be carried out by laser beam scanning or by photoirradiation through a photomask. Development (or dissolution) of a non-irradiated area (unexposed area) formed by such a pattern exposure with a developer enables the formation of a pattern or an image.

As the developer, an aqueous alkali solution or an organic solvent can be used.

Examples of the aqueous alkali solution include an alkaline aqueous solution including an aqueous solution of an alkali metal hydroxide such as potassium hydroxide, sodium hydroxide, potassium carbonate, and sodium carbonate; an aqueous solution of a quaternary ammonium hydroxide such as tetramethylammonium hydroxide, tetraethylammonium hydroxide, and choline; and an aqueous solution of an amine such as ethanolamine, propylamine, and ethylenediamine.

The alkali developer is typically a 10% by mass or less aqueous solution, and a 0.1 to 3.0% by mass aqueous solution and the like are preferably used. The alkali developer may include alcohols or surfactants and each amount is preferably 0.05 to 10 parts by mass based on 100 parts by mass of the alkali developer.

Among them, an aqueous solution of 0.1 to 2.38% by mass tetramethylammonium hydroxide may be used.

As an organic solvent in the developer, a common organic solvent may be used, and examples of the solvent include acetone, acetonitrile, toluene, dimethylformamide, methanol, ethanol, isopropanol, propylene glycol methyl ether, propylene glycol ethyl ether, propylene glycol propyl ether, propylene glycol butyl ether, propylene glycol methyl ether acetate, propylene glycol ethyl ether acetate, propylene glycol propyl ether acetate, propylene glycol butyl ether acetate, ethyl lactate, and cyclohexanone. These solvents may be used singly or in combination of two or more of them. Among the organic solvents, in particular, propylene glycol methyl ether, propylene glycol methyl ether acetate, ethyl lactate, and the like are preferably used.

EXAMPLES

The following epoxy compounds were prepared.

Preparation of Epoxy Compound

Synthesis Example 1

Synthesis of tris-(4,5-epoxypentyl)-isocyanurate

In a reaction vessel, 106 g of isocyanuric acid and 420 mL of water were charged to make a slurry. Next, to the reaction vessel, 206 g of 48% aqueous sodium hydroxide solution was added dropwise, and the whole was reacted at a temperature of 60 to 70° C. for 2 hours. Then, water was removed by evaporation, and the residue was washed with methanol and dried to afford 157.5 g of sodium isocyanurate as a white crystal. In a reaction vessel equipped with a stirrer and a condenser, 400 mL of dimethylformamide was charged as a solvent, and 157.5 g of sodium isocyanurate and 361.4 g of 5-bromo-1-pentene were reacted at 120 to 125° C. for 6 hours. Then, an inorganic salt was filtered off, and the filtrate was extracted with toluene. The extract was washed with water and dried, and the solvent was removed by evaporation to afford 205 g of tris-5-pentenyl isocyanurate as a pale brown oil. In a reaction vessel equipped with a stirrer and a condenser, 8,700 mL of methylene chloride was charged as a solvent, then 205 g of tris-5-pentenyl isocyanurate was added, and 815 g of m-chloroperbenzoic acid was slowly added at 30° C. or less. The whole was reacted at 25° C. for 4 hours. After the completion of the reaction, 3,000 mL of 10% aqueous sodium hydrogen sulfite solution was slowly added at 20° C. or less. Insoluble substances were filtered off, and chloroform was added for solvent extraction. The extract was thoroughly washed with 10% aqueous sodium hydrogen sulfite solution and saturated aqueous sodium hydrogen carbonate solution. Then, the organic phase was dried, and the solvent was removed by evaporation to give a crude product. The crude product was purified by silica gel chromatography (hexane and ethyl acetate in a ratio of 1:1) to afford 161.7 g of transparent oil. The obtained epoxy compound was tris(4,5-epoxypentyl)isocyanurate corresponding to Formula (1-1).

The epoxy compound was regarded as (i-1).

Synthesis Example 2

Synthesis of tris-(5,6-epoxyhexyl)-isocyanurate

In a reaction vessel, 106 g of isocyanuric acid and 420 mL of water were charged to make a slurry. Next, to the reaction vessel, 206 g of 48% aqueous sodium hydroxide solution was added dropwise, and the whole was reacted at a temperature of 60 to 70° C. for 2 hours. Then, water was removed by evaporation, and the residue was washed with methanol and dried to afford 157.5 g of sodium isocyanurate as a white crystal. In a reaction vessel equipped with a stirrer and a condenser, 400 mL of dimethylformamide was charged as a solvent, and 157.5 g of sodium isocyanurate and 395.4 g of 6-bromo-1-hexene were reacted at 120 to 125° C. for 6 hours. Then, an inorganic salt was filtered off, and the filtrate was extracted with toluene. The extract was washed with water and dried, and the solvent was removed by evaporation to afford 230.8 g of tris-6-hexenyl isocyanurate as a pale brown oil. In a reaction vessel equipped with a stirrer and a condenser, 8,700 mL of methylene chloride was charged as a solvent, then 230.8 g of tris-6-hexenyl isocyanurate was added, and 815 g of m-chloroperbenzoic acid was slowly added at 30° C. or less. The whole was reacted at 25° C. for 4 hours. After the completion of the reaction, 3,000 mL of 10% aqueous sodium hydrogen sulfite solution was slowly added at 20° C. or less. Insoluble substances were filtered off, and chlorofotin was added for solvent extraction. The extract was thoroughly washed with 10% aqueous sodium hydrogen sulfite solution and saturated aqueous sodium hydrogen carbonate solution. Then, the organic phase was dried, and the solvent was removed by evaporation to give a crude product. The crude product was purified by silica gel chromatography (hexane and ethyl acetate in a ratio of 2:1, 3:2, and then 1:1) to afford 182.1 g of transparent oil. The obtained epoxy compound was tris(5,6-epoxyhexyl)isocyanurate corresponding to Formula (1-2).

The epoxy compound was regarded as (i-2).

Synthesis Example 3

Synthesis of tris-(3,4-epoxybutyl)-isocyanurate

In a reaction vessel, 106 g of isocyanuric acid and 420 mL of water were charged to make a slurry. Next, to the reaction vessel, 206 g of 48% aqueous sodium hydroxide solution was added dropwise, and the whole was reacted at a temperature of 60 to 70° C. for 2 hours. Then, water was removed by evaporation, and the residue was washed with methanol and dried to afford 157.5 g of sodium isocyanurate as a white crystal. In a reaction vessel equipped with a stirrer and a condenser, 400 mL of dimethylformamide was charged as a solvent, and 157.5 g of sodium isocyanurate and 327.4 g of 4-bromo-1-butene were reacted at 120 to 125° C. for 6 hours. Then, an inorganic salt was filtered off, and the filtrate was extracted with toluene. The extract was washed with water and dried, and the solvent was removed by evaporation to afford 179 g of tris-4-butenyl isocyanurate as a pale brown oil. In a reaction vessel equipped with a stirrer and a condenser, 8,700 mL of methylene chloride was charged as a solvent, then 179 g of tris-4-butenyl isocyanurate was added, and 815 g of m-chloroperbenzoic acid was slowly added at 30° C. or less. The whole was reacted at 25° C. for 4 hours. After the completion of the reaction, 3,000 mL of 10% aqueous sodium hydrogen sulfite solution was slowly added at 20° C. or less. Insoluble substances were filtered off, and chloroform was added for solvent extraction. The extract was thoroughly washed with 10% aqueous sodium hydrogen sulfite solution and saturated aqueous sodium hydrogen carbonate solution. Then, the organic phase was dried, and the solvent was removed by evaporation to give a crude product. The crude product was purified by silica gel chromatography (hexane and ethyl acetate in a ratio of 1:1, and then 1:2) to afford 141.3 g of transparent oil. The obtained epoxy compound was tris (3,4-epoxybutyl)isocyanurate corresponding to Formula (6-1).

The epoxy compound was regarded as (i-3).

As a liquid epoxy compound, CE-2021P (trade name, manufactured by Daicel Corporation, Formula (5-1)) was prepared. The epoxy compound was regarded as (i-4).

As a crystalline epoxy compound, tris-(2,3-epoxypropyl)-isocyanurate (Formula (4-3), manufactured by Nissan Chemical Industries, Ltd., trade name: TEPIC) was prepared. The epoxy compound was dissolved in DMF (dimethylformamide) to prepare a 20% by mass solution. The epoxy compound was regarded as (i-5).

[Preparation of Photo Acid Generator]

A solution of an iodonium salt in propylene carbonate (Formula (A-8), active component 75%, manufactured by BASF Japan Ltd. (formerly Ciba), trade name: IRGACURE250) was prepared. The photo acid generator was regarded as (ii-1).

A solution of a sulfonium salt in propylene carbonate (Formula (A-9), active component 50%, manufactured by ADEKA CORPORATION, trade name: SP-170) was prepared. The photo acid generator was regarded as (ii-2).

An iodonium salt (Formula (A-10), manufactured by Rhodia, trade name: PI-2074) was prepared. The photo acid generator was regarded as (ii-3).

A sulfonium salt (Formula (A-1), manufactured by Midori Kagaku Co., Ltd., trade name: DTS-102) was prepared. The photo acid generator was regarded as (ii-4).

A sulfonium salt (Formula (A-2), manufactured by Midori Kagaku Co., Ltd., trade name: DTS-103) was prepared. The photo acid generator manufactured by Midori Kagaku Co., Ltd. was regarded as (ii-5).

A sulfonium salt (Formula (A-3), manufactured by Midori Kagaku Co., Ltd., trade name: DTS-105) was prepared. The photo acid generator was regarded as (ii-6).

[Preparation of Thermal Acid Generator]

A solution of a sulfonium salt in γ-butyrolactone (Formula (C-1), active component 48.5%, manufactured by Sanshin Chemical Industry Co., Ltd., trade name: Sanaid SI-100L) was prepared. Thermal acid generator was regarded as (iii-1).

A solution of a sulfonium salt in propylene carbonate (Formula (C-2), active component 66%, manufactured by ADEKA CORPORATION, trade name: CP-66) was prepared. The thermal acid generator was regarded as (iii-2).

[Photo-Curing Test of Curable Composition]

An epoxy compound and an acid generator was mixed at 40° C. and degassed to prepare a curable composition. In Tables 1 to 7, each amount added is represented by parts by mass and each amount of the epoxy compounds and the acid generators is represented by parts by mass of a corresponding active component. The solutions of the photo acid generators in propylene carbonate (ii-1) and (ii-2) were used without treatment. The photo acid generator (ii-3) that is solid at ambient temperature was dissolved in (5 parts by weight of) propylene carbonate at 40° C. to prepare a 67% by mass solution, and then mixed with an epoxy compound. The photo acid generators (ii-4), (ii-5), and (ii-6) that are solid at ambient temperature were dissolved in (5 parts by weight of) propylene carbonate at 40° C. to prepare a 50% by mass solution, and then mixed with an epoxy compound.

The prepared curable composition was irradiated with UV (ultraviolet light) from a distance of 9.5 cm. Photo-curing behavior was observed with a rheometer (viscometer). The time (seconds) until the storage elastic modulus reached $1 \times 10^4$ Pa was defined as curing time (seconds). The UV irradiation was carried out until 600 seconds.

The rheometer used was manufactured by Reologica (trade name: VAR-50) and the lamp used was a Hg—Xe lamp. The UV irradiation was carried out at a UV wavelength of 365 nm and an irradiation intensity of 20 mW/cm². For the UV irradiation, the irradiation window material was a hard glass having a thickness of 3 mm, and the coating (cured film) formed from the curable composition had a film thickness of 50 μm. The photo-curing speed of the curable composition was also determined.

TABLE 1

| Component | Example 1 | Example 2 | Example 3 | Example 4 | Example 5 |
|---|---|---|---|---|---|
| (i-1) | 100 | 100 | 100 | | |
| (i-2) | | | | 100 | 100 |
| (ii-1) | 3 | | | 3 | |
| (ii-2) | | 3 | | | 3 |
| (ii-3) | | | 3 | | |
| (ii-4) | | | | | |
| (ii-5) | | | | | |
| (iii-1) | | | | | |
| (iii-2) | | | | | |
| Curing time (seconds) | 140 | 160 | 170 | 85 | 60 |

TABLE 2

| Component | Example 6 | Example 7 | Example 8 | Example 9 | Example 10 |
|---|---|---|---|---|---|
| (i-1) | | 100 | 100 | 100 | 100 |
| (i-2) | 100 | | | | |
| (ii-1) | | | | | |
| (ii-2) | | | | | |
| (ii-3) | 3 | | | | |
| (ii-4) | | 5 | 3 | 2 | |
| (ii-5) | | | | | 5 |
| (iii-1) | | | | | |
| (iii-2) | | | | | |
| Curing time (seconds) | 50 | 60 | 60 | 65 | 50 |

TABLE 3

| Component | Example 11 | Example 12 | Example 13 | Example 14 |
|---|---|---|---|---|
| (i-1) | 100 | 100 | 100 | 100 |
| (i-2) | | | | |
| (ii-1) | | | | |
| (ii-2) | | | | |
| (ii-3) | | | | |
| (ii-4) | | | 5 | 5 |
| (ii-5) | 3 | 2 | | |
| (iii-1) | | | 2 | |
| (iii-2) | | | | 2 |
| Curing time (seconds) | 50 | 70 | 95 | 60 |

TABLE 4

| Component | Example 15 | Example 16 | Example 17 |
|---|---|---|---|
| (i-1) | 75 | 50 | 25 |
| (i-4) | 25 | 50 | 75 |
| (ii-4) | 5 | 5 | 5 |
| Curing time (seconds) | 65 | 75 | 90 |

TABLE 5

| Component | Comparative Example 1 | Comparative Example 2 | Comparative Example 3 | Comparative Example 4 | Comparative Example 5 |
|---|---|---|---|---|---|
| (i-3) | 100 | 100 | 100 | | |
| (i-4) | | | | 100 | 100 |
| (i-5) | | | | | |
| (ii-1) | 3 | | | 3 | |
| (ii-2) | | 3 | | | 3 |
| (ii-3) | | | 3 | | |
| (ii-4) | | | | | |
| (ii-5) | | | | | |
| (iii-1) | | | | | |
| (iii-2) | | | | | |
| Curing time (seconds) | Not cured | Not cured | Not cured | 170 | 140 |

TABLE 6

| Component | Comparative Example 6 | Comparative Example 7 | Comparative Example 8 | Comparative Example 9 | Comparative Example 10 |
|---|---|---|---|---|---|
| (i-3) | | | | | |
| (i-4) | 100 | 100 | 100 | 100 | 100 |
| (i-5) | | | | | |
| (ii-1) | | | | | |
| (ii-2) | | | | | |
| (ii-3) | 3 | | | | |
| (ii-4) | | 5 | 3 | 2 | |
| (ii-5) | | | | | 5 |
| (iii-1) | | | | | |
| (iii-2) | | | | | |
| Curing time (seconds) | 180 | 125 | 180 | 280 | 120 |

TABLE 7

| Component | Comparative Example 11 | Comparative Example 12 | Comparative Example 13 | Comparative Example 14 | Comparative Example 15 |
|---|---|---|---|---|---|
| (i-3) | | | | | |
| (i-4) | 100 | 100 | 100 | 100 | |
| (i-5) | | | | | 100 |
| (ii-1) | | | | | |
| (ii-2) | | | | | |
| (ii-3) | | | | | |
| (ii-4) | | | 5 | 5 | 5 |
| (ii-5) | 3 | 2 | | | |
| (iii-1) | | | 2 | | |
| (iii-2) | | | | 2 | |
| Curing time (seconds) | 170 | 260 | 140 | 130 | Not cured |

[Evaluation of Physical Property of Cured Film]

An epoxy compound and an acid generator was mixed at 40° C. and degassed to prepare a curable composition. In Table 8, each amount added is represented by parts by mass and each amount of the epoxy compounds and the acid generators is represented by parts by mass of a corresponding active component. The photo acid generators (ii-4) and (ii-6) that are solid at ambient temperature were dissolved in (5 parts by weight of) propylene carbonate at 40° C. to prepare a 50% by mass solution, and then mixed with an epoxy compound.

The prepared curable composition was applied using an applicator onto a bonderized sheet (galvanized steel sheet treated with phosphoric acid, a thickness of 0.5 mm) degreased with acetone. Then, the coated sheet was irradiated with UV from a UV lamp at a distance of 15 cm for curing the curable composition to afford a coating. The UV irradiation was carried out using a Hg—Xe lamp at an irradiation UV wavelength of 365 nm and an irradiation intensity of 20 mW/cm$^2$. The coating (cured film) formed from the curable composition had a film thickness of 50 μm. Physical properties of the obtained coating (cured film) were evaluated.

(Measurement of Tack Free Time)

UV irradiation time (tack free time) until a coating did not adhere to fingers was determined.

(Acetone Rubbing Test)

The prepared curable composition was irradiated with UV (ultraviolet light). UV irradiation time (acetone rubbing time) until the coating did not adhere through rubbing of acetone was determined.

(Pencil Hardness Test)

The test was carried out at a temperature of 23° C. by hand-swaying.

(Adhesion Test)

The test was carried out by cross-cut method at a cutting distance of 1 mm. The number of areas that were not removed was counted among 100 pieces of the cross-cut areas.

(Determination of Acetone Extraction Ratio)

A substrate coated with a curable composition was immersed in acetone at room temperature for 24 hours and the acetone extraction ratio was calculated from the weights before and after the immersion.

(Bending Resistance Test)

A substrate on which the coating was formed was pressed to a pole having a mandrel diameter of ϕ10 mm to make an angle and the removal limit angle of the coating on the substrate obtained by photo-curing was determined.

[Evaluation of Film Physical Property of Cured Film]

An epoxy compound and an acid generator was mixed at 40° C. and degassed to prepare a curable composition. In Table 8, each amount added is represented by parts by mass and each amount of the epoxy compounds and the acid generators is represented by parts by mass of a corresponding active component. The photo acid generators (ii-4) and (ii-6) that are solid at ambient temperature were dissolved in (5 parts by weight of) propylene carbonate at 40° C. to prepare a 50% by mass solution, and then mixed with an epoxy compound.

The prepared curable composition was applied using an applicator onto a film having a thickness of 100 μm degreased with acetone. Then, the coated film was irradiated with UV from a UV lamp at a distance of 15 cm for curing the curable composition to afford a coating. The UV irradiation was carried out using a Hg—Xe lamp at an irradiation UV wavelength of 365 nm and an irradiation intensity of 20 mW/cm$^2$. The coating (cured film) formed from the curable composition had a film thickness of 50

(Measurement of Glass Transition Temperature Tg (° C.))

The measurement was carried out in an extension mode of TMA.

(Measurement of Coefficient of Thermal Expansion CTE)

The value ($\times 10^{-5}/°$ C.) at 25° C. to Tg is shown.

(Measurement of Curing Shrinkage Ratio)

The specific gravity before curing and the specific gravity after curing were determined, and the ratio was calculated from the difference in accordance with the equation.

(Specific gravity after curing−specific gravity before curing)/(specific gravity after curing)×100

TABLE 8

| Component | Example 18 | Example 19 | Comparative Example 16 | Comparative Example 17 |
|---|---|---|---|---|
| (i-1) | 100 | 100 | | |
| (i-4) | | | 100 | 100 |
| (ii-4) | 5 | | 5 | |
| (ii-6) | | 5 | | 5 |
| Tack free time (seconds) | 30 | 300 | 15 | 360 |
| Acetone rubbing time (seconds) | 30 | 390 | 120 | 450 |
| Pencil hardness | 5H | 5H | 5H | 3H |
| Adhesion test | 100 | 100 | 100 | 100 |
| Acetone extraction ratio (%) | 1.0 | 0.5 | 1.3 | 2.2 |
| Bending resistance test | 95 to 120° | Not removed | Not removed | 110° |
| Tg | 74 | 68 | 109 | |
| CTE | 11.3 | 11.9 | 14.2 | 18.1 |
| Specific gravity (before curing) | 1.22 | 1.22 | 1.17 | 1.17 |
| Specific gravity (after curing) | 1.29 | 1.28 | 1.22 | 1.22 |
| Curing shrinkage ratio (%) | 5.4 | 4.7 | 4.1 | 4.1 |

The curable composition using the epoxy compound of Formula (1) had a higher photo-curing speed than that of the photocurable composition using the conventional alicyclic epoxy compound. In addition, the obtained cured film had a low acetone extraction ratio. This reveals that the curable composition was thoroughly cured to provide a cured film having excellent physical properties such as solvent resistance.

Even when the curable composition including a solution of the crystalline epoxy compound (i-5) and the photo acid generator was applied to a substrate followed by UV irradiation, the curable composition was not photo-cured (Comparative Example 15). It is supposed that even when the crystalline epoxy compound was used as a solution, the curable composition was not photo-cured because the epoxy compound was recrystallized at the time of application onto a substrate to become opaque.

In the present invention, it is supposed that exposed light is homogeneously applied into a coating for curing because the liquid epoxy compound is used. It was revealed that, among various epoxy compounds, the use of the liquid epoxy compound is important and elongation of the distance from the triazinetrione ring to the epoxy ring can provide a highly curable composition.

[Thermal Curing Using Thermal Acid Generator]

An epoxy compound and an acid generator were mixed at room temperature and degassed to prepare a heat-curable composition. In Table 9, each amount added is represented by parts by mass and each amount of the epoxy compounds and the acid generators is represented by parts by mass of a corresponding active component. The thermal acid generators (iii-1) and (iii-2) that are solid at ambient temperature were dissolved in (5 parts by weight of) propylene carbonate at room temperature to prepare a 50% by mass solution, and then mixed with an epoxy compound. Then, the mixture was applied onto a glass plate on which a silicon spacer having a thickness of 2 mm was placed and another glass plate was placed on the silicon spacer for interposing the mixture. Next, the whole was heated at 80° C. for 1 hour and further heated at 150° C. for 1 hour for curing.

TABLE 9

| Component | Example 20 | Example 21 | Comparative Example 18 | Comparative Example 19 |
|---|---|---|---|---|
| (i-1) | 100 | 100 | | |
| (i-4) | | | 100 | 100 |
| (iii-1) | 2 | | 2 | |
| (iii-2) | | 2 | | 2 |
| Tg | 165 | 134 | Could not measured | 168 |

INDUSTRIAL APPLICABILITY

A cured product formed from the curable composition of the present invention has characteristics such as fast curing, transparency, and small curing shrinkage and can be used for coating and adhesion of electronic components, optical components, and precision mechanical components. For example, it can be used for adhesion of lenses in cell phones and cameras, optical devices such as a light emitting diode (LED) and a semiconductor laser (LD), liquid crystal panels, biotips, camera parts such as a lens and a prism, magnetic parts of hard disks in personal computers and the like, pickups (parts of importing optical information reflected from a disk) in CD and DVD players, cones and coils of speakers, magnets for motors, circuit boards, electronic components, and parts in engines for automobiles and the like.

Examples of the application for hard coating materials in order to protect surfaces of automobile bodies, lamps, electrical appliances, construction materials, plastics, and the like include bodies of automobiles and motorbikes, lenses and mirrors of headlights, plastic lenses for glasses, cell phones, game machines, optical films, and ID cards.

Examples of the application for ink materials for printing on a metal such as aluminum, plastics, and the like include cards such as credit cards and membership cards, switches of electrical appliances and office automation equipment, print inks for keyboards, and inkjet printer inks for CDs, DVDs, and the like.

Additional examples of the application of the curable composition of the present invention include a technique for forming a complicated solid object by curing a resin in combination with three-dimensional CAD, optical shaping such as modeling of industrial products, coating of optical fibers, adhesion, optical waveguides, and thick film resist (for MEMS).

The invention claimed is:

1. A curable composition comprising:
   an epoxy compound of Formula (1):

Formula (1)

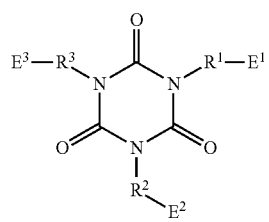

where each of $R^1$, $R^2$, and $R^3$ is independently an optionally branched $C_{2-6}$ alkylene group; and each of $E^1$, $E^2$, and $E^3$ is independently an organic group of Formula (2) or Formula (3):

Formula (2)

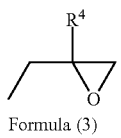

Formula (3)

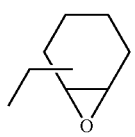

where $R^4$ is a hydrogen atom or a methyl group; and
an acid generator.

2. The curable composition according to claim 1, wherein in Formula (1)
    each of $E^1$, $E^2$, and $E^3$ is the organic group of Formula (2), or
    each of $E^1$, $E^2$, and $E^3$ is the organic group of Formula (3).

3. The curable composition according to claim 2, wherein in Formula (1), each of $R^1$, $R^2$, and $R^3$ is a $C_{2-4}$ alkylene group and each of $E^1$, $E^2$, and $E^3$ is the organic group of Formula (2).

4. The curable composition according to claim 1, wherein the acid generator is a photo acid generator or a thermal acid generator.

5. The curable composition according to claim 1, wherein the acid generator is an onium salt.

6. The curable composition according claim 1, wherein the acid generator is a sulfonium salt compound or an iodonium salt compound.

7. The curable composition according to claim 1, further comprising, in addition to the epoxy compound (A) of Formula (1), an epoxy compound (B) having at least two epoxy groups and having a structure different from that of the epoxy compound (A).

8. The curable composition according to claim 7, wherein the epoxy compound (B) is a compound of Formula (4) or Formula (5):

Formula (4)

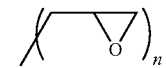

Formula (5)

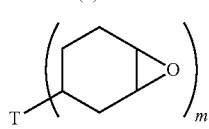

where n and m are each an integer of 2 to 5; and T is an optionally substituted divalent to pentavalent organic group of a $C_{1-12}$ alkylene group, a $C_{1-12}$ oxyalkylene group, a $C_{6-20}$ arylene group, a $C_{6-20}$ oxyarylene group, a residue of a triazinetrione ring from which one to three hydrogen atoms are removed, an oxycarbonyl group, or a combination of these.

9. The curable composition according to claim 1, wherein the curable composition includes the acid generator in a ratio of 0.1 to 20% by mass with respect to the epoxy compound.

* * * * *